United States Patent [19]

Hollander et al.

[11] Patent Number: 4,949,274

[45] Date of Patent: Aug. 14, 1990

[54] TEST METERS

[75] Inventors: Milton B. Hollander; William E. McKinley, both of Stamford; James P. Crimmins; Ian K. Storer, both of Westport, all of Conn.

[73] Assignee: Omega Engineering, Inc., Stamford, Conn.

[21] Appl. No.: 312,880

[22] PCT Filed: May 18, 1988

[86] PCT No.: PCT/US88/01648

§ 371 Date: Oct. 31, 1988

§ 102(e) Date: Oct. 31, 1988

Related U.S. Application Data

[63] Continuation-in-part of Ser. No. 53,385, May 22, 1987, abandoned.

[51] Int. Cl.[5] ............................................ G01R 19/00
[52] U.S. Cl. .................................... 364/483; 364/131; 364/513.5; 324/99 D
[58] Field of Search ........... 364/481, 483, 550, 551.01, 364/709, 710, 131, 132, 513.5; 324/99 D, 76 R, 73 R, 115; 307/152; 381/51; 328/132; 340/661, 662, 663

[56] References Cited

U.S. PATENT DOCUMENTS 3,081,431 3/1963 Werner et al. .
3,315,163 4/1967 Lutz .
3,828,252 8/1974 Wolff .
3,834,238 9/1976 Mueller et al. .
4,298,837 11/1981 Koslar .
4,336,529 6/1982 Buan .
4,428,685 1/1984 Lemelson et al. .
4,532,470 7/1985 Wiesmann .
4,563,770 1/1986 Lemelson et al. .
4,563,771 1/1986 Gorgone et al. .
4,567,763 2/1986 Schiffbauer .
4,571,588 2/1986 Lee et al. .
4,571,689 2/1986 Hildebrand .
4,633,221 12/1986 Bradshaw .
4,634,971 1/1987 Johnson et al. .
4,672,306 6/1987 Thong .

OTHER PUBLICATIONS

Article entitled, "General Purpose Talking Laboratory Instrument For The Visually Handicapped", by Alger Salk, et al, published in Dec., 1980 American Institute of Physics.

Primary Examiner—Parshotam S. Lall
Assistant Examiner—Ellis B. Ramirez
Attorney, Agent, or Firm—Bruce E. Hosmer

[57] ABSTRACT

Test meters, particularly of the type employed for testing electrical circuits, e.g. multimeters, are improved in operational efficiency. In one aspect, remote selection of test and/or report format frees the operators hands for concentration on a test piece. In another test results or format information are conveyed as synthesized speech in any of a number of selectable formats. By combining both aspects in a hand-held multimeter, a high degree of interaction between the operator and the meter is achieved.

24 Claims, 10 Drawing Sheets

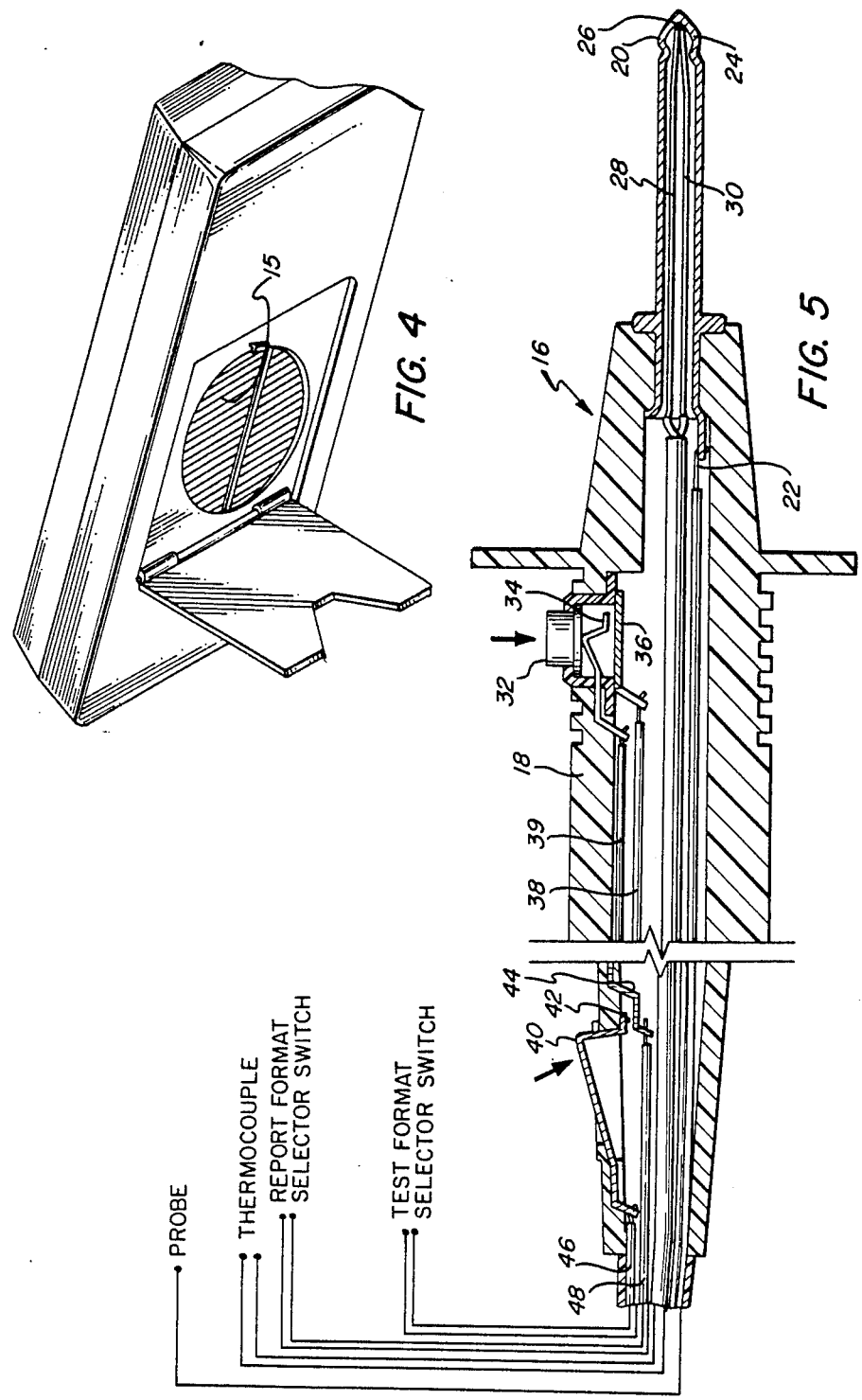

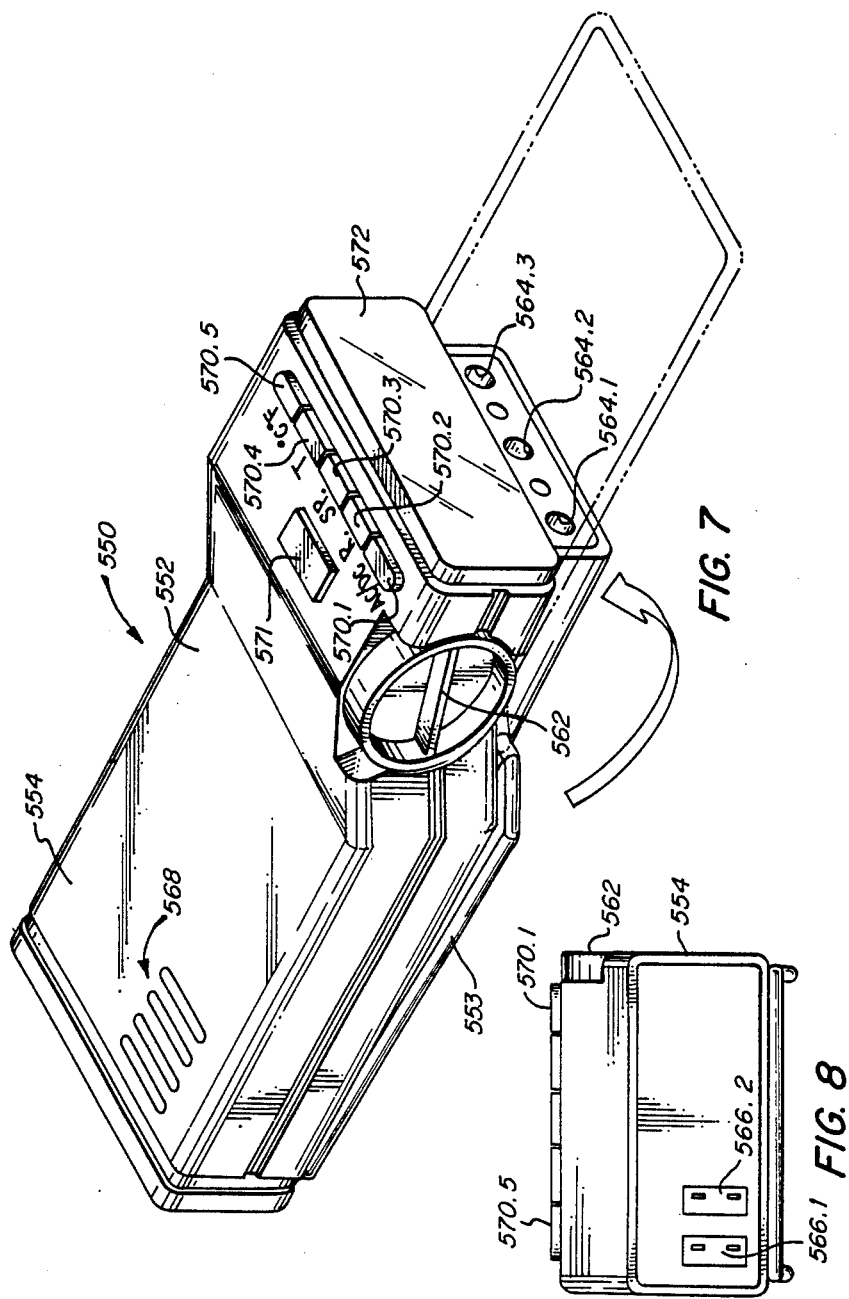

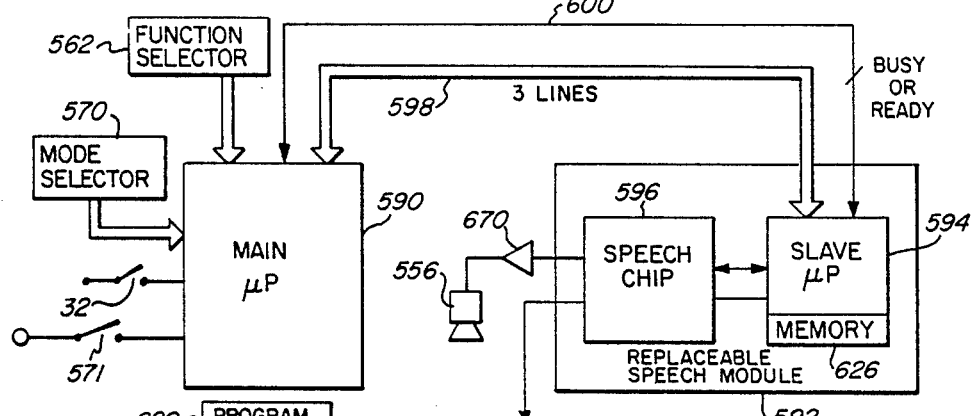
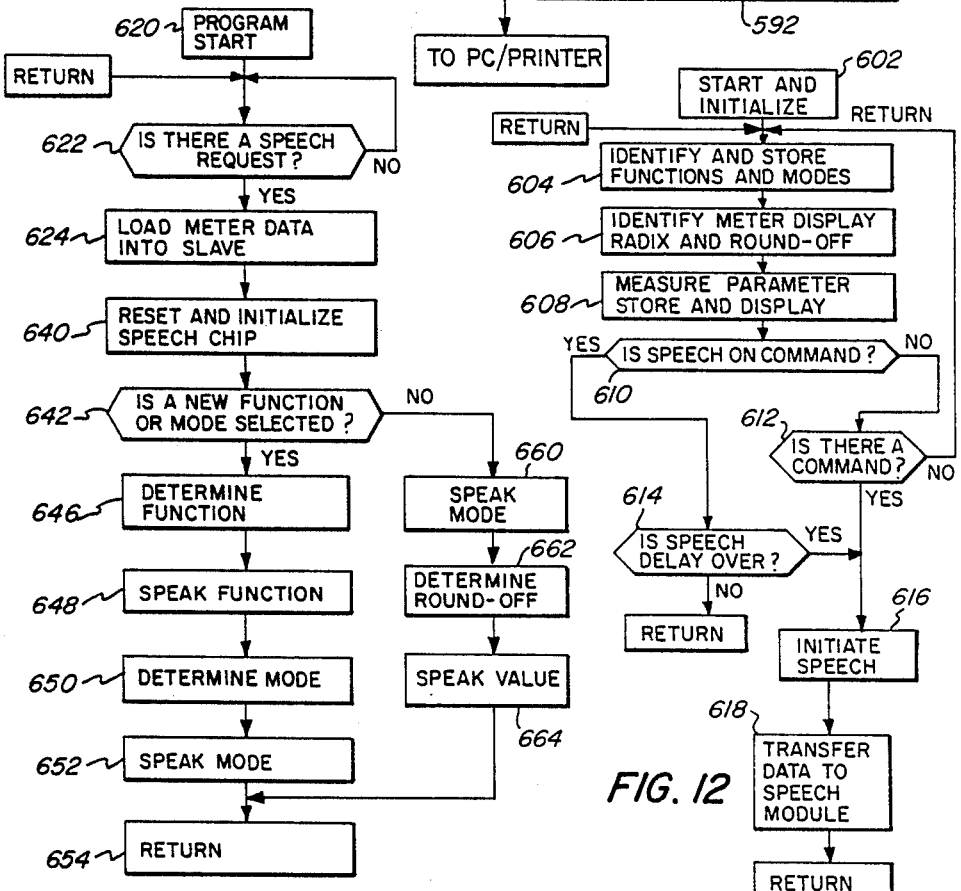
FIG. 11
FIG. 12
FIG. 13

```
                    METER DATA
         CURRENT READING: (4 DIGITS)
         CURRENT DISPLAY: (4 DIGITS)
  630    ZERO FLAG: NON-ZERO (0), ZERO (1)
         SIGN FLAG: POSITIVE (0), NEGATIVE (1)
         NUMBER OF DISPLAYED DIGITS AFTER RADIX POINT: (0-3)
         PRESENT FUNCTION: T(0), mV(1), V(2), OHMS(3),
                           mA(4), A(5)
         RANGE OF PRESENT FUNCTION: (0-7)
         NEW FUNCTION FLAG: OLD (0), NEW (1)
         TEMPERATURE MODE: T1(0), T2(1), T1-T2(2)
         TEMPERATURE UNIT: DEGREES C°(0), DEGREES F°(1)
         WAVEFORM TYPE: DC(0), AC(1)
         OVERRANGE FLAG: WITHIN RANGE (0), OVERRANGE(1)
         CONTINUITY FLAG: OPEN CIRCUIT (0), SHORT CIRCUIT(1)
         NUMBER OF DELAY LOOPS TO PERFORM
```

FIG. 15

```
                 SPEECH STORED DATA
         "ZERO" THROUGH "TWENTY"
         "THIRTY", "FORTY", ... "HUNDRED"
  672    "THOUSAND"
         "POINT", "MINUS", "NEGATIVE"
         "MILLI", "MEGA", "K", "C", "F", "A.C.", "D.C."
         "T", "VOLTS", "AMPS", "OHMS", "DEGREES"
         "OVERRANGE", "OPEN", "SHORT", "CIRCUIT"
```

FIG. 16

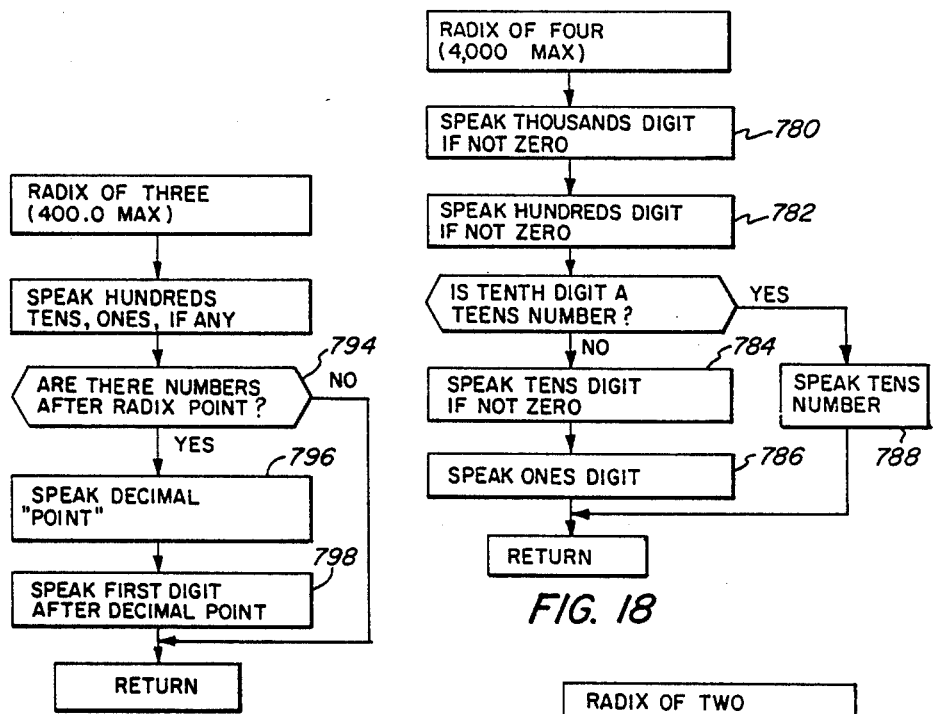
FIG. 18
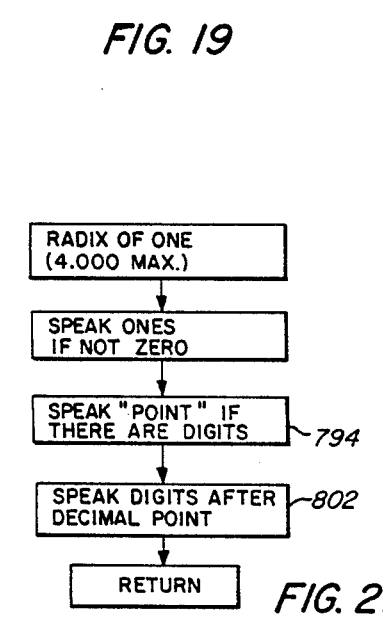
FIG. 19
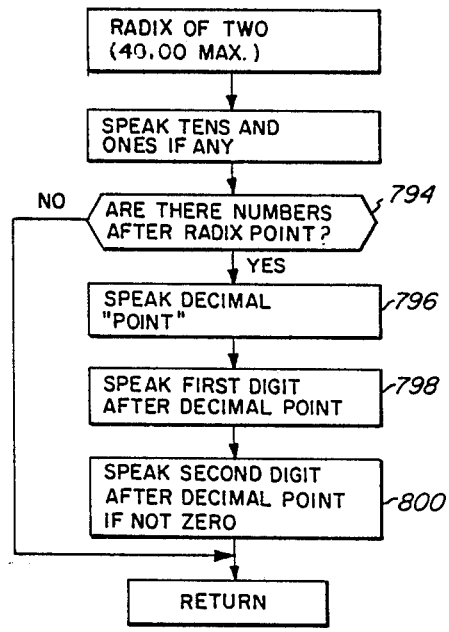
FIG. 20
FIG. 21

TEST METERS

This application is a Continuation in Part of U.S. Pat. Ser. No. 07/053,385 filed May 22, 1987 by MILTON BERNARD HOLLANDER and WILLIAM EARL McKINLEY entitled TEST METERS.

FIELD OF THE INVENTION

The present invention relates to test meters, particularly of the type employed for testing an electrical circuit or component for one or a plurality of parameters, e.g., multimeters; and provides improvements in meters of this type which greatly enhance their convenience and their efficiency of use.

Multimeters are well known in electronics, research, and trouble-shooting contexts for testing, typically voltage, current and resistance with a single instrument. Often, meters of this type will further have temperature-sensing capability. These meters almost universally have a visual display for reporting test results and one or more switches on the meter for selecting the test parameter and scale range desired. Hand-held probes are typically employed for contacting a work piece at suitable test points.

Unfortunately, where it is necessary to run a variety of tests, it is often inconvenient to set the probes down, change switch positions, and again place the probes in contact with the desired test points.

It is also inconvenient at times for the operator to change his direction of view from the test points to the visual display. While meters with voice reporting are know, the reporting format will in many circumstances detract from its apparent appeal.

It would be advantageous to have a test meter which would overcome at least one of the noted disadvantages by enabling switching between a plurality of test or report formats without moving test probes from test points and/or enabling variations in the format of an audible report.

BACKGROUND ART

In U.S. Pat. No. 4,563,770, Lemelson and Grund disclose an electrical measuring instrument, such as a multimeter, which enables the results of a measurement to be displayed visually as well as by synthesized speech. The meter includes an electrical circuit for the analyzing signals generated in making measurements to assure that no speech report is produced until the signals have stabilized. A foot-operated, normally-open switch permits the operator to trigger the operation of the speech synthesizer when it is desired to generate audible synthetic speech, and also provides the operator with a means for repeating the most recent measurement in the event the operator did not properly hear the previous speech indication of the measurement. While an object of the invention is to enable blind persons to more easily employ the meter due to its speech report, the meter does not solve some of the more troublesome problems with meters with conventional visual displays, much less with speech reporting systems.

Regardless of the means employed for reporting, be it visual or audible, test meters have the nearly universal problem that the operator's hands and vision must usually give attention to the area of the test points. Often it is desired to switch among a plurality of test or report formats; however, there is no provision for such by the device of Lemelson and Grund. For example, where the operator has both hands busy on a complex electrical workpiece and wishes to test resistance followed by voltage and then current, he must remove his test probes from the locale of the test points, manually reset the meter, and again find the test points.

In U.S. Pat. No. 4,604,569, Tedd and Kennedy describe a multimeter having two slide switches on the meter to control test format and an audible alarm to warn of incompatible settings to control test format. Each of the switches is set by the operator to control a different measurement function Where the operator makes a selection of two incompatible setting, a buzzer sounds. While this feature is advantageous, it requires manual setting of the switches and permits the incompatible settings to be made. It would be more desirable to have a meter which could be set from a remote location, e.g., at the location where the operator is using his hands to perform the test of the circuitry, and preferably to include circuitry which would not permit the incompatible test format to be selected and would audibly advise the operator of such by spoken word.

In U.S. Pat. No. 4,633,221, Bradshaw and Evans describe a multimeter including a dual slope analog-to-digital converter having automatic short cycle range determination. The converter adjusts the time period of the signal integrate phase to accommodate different ranges of input signals. Range selection is achieved automatically and rapidly without the need for displaying an out of range reading. While this appears to enhance the utility of typical autoranging meters, it would be desirable to have a meter which, preferably would permit selecting a desired test formal without the operator removing his hands or attention from his workpiece. It would be further desirable to have a meter of this type which would let the operator know in plain English or other language of choice, which test format, in terms of parameters and scale had been selected.

Enabling a meter to report results as synthesized speech is not a full answer to the problems with convenience and efficiency of use. Simply verbalizing reports adds a drawback that, in many cases, much of the information is repetitive and need not be reported. For example, where a long series of tests of one parameter is called for, it is not necessary to report that parameter in all instances and to report all decimal points placements. Often a format, which enabled once reporting the parameter being tested followed by a series of significant digit reports for each test point would not only be adequate, but be desired And, under the circumstances of the present invention, where remote selection of test format, is available, it would be advantageous to enable an audible report of the test format selected.

DISCLOSURE OF THE INVENTION

It is a principal object of the present invention to provide a meter capable of testing at least one physical parameter and audibly reporting test information in a plurality of selectable formats.

It is another principal object of the present invention to provide a test meter having means for selecting, from a position remote from the meter, between a plurality of test and/or report formats.

It is a further object of the present invention to provide a test meter having at least one test probe which includes means for selecting among a plurality of test and/or report formats.

It is another object of the present invention to provide a meter capable of testing at least one physical parameter and reporting test information as synthesized speech in a plurality of selectable formats and which can be conveniently adapted to different languages.

It is a more specific object of the present invention to provide an electrical test meter capable of testing voltage, current, resistance and preferable temperature, and reporting test information, including test parameter, scale of values of sensed parameters, as synthesized speech in a plurality of selectable formats and further including means for selecting, from a point remote from the meter, between a plurality of test and/or report formats.

It is a further object of the present invention to provide an electrical test meter capable of testing voltage, current and resistance and reporting test information such as test parameter, scale or sensed values, as synthesized speech in a plurality of selectable formats and further including at least one test probe which includes means for selecting from a plurality of test and/or report formats.

These and other objects are accomplished according to the invention which provides several improvements. These improvements can be employed separately or in combination to enhance the convenience and efficiency of using a test meter in a variety of practical situations.

According to one aspect of the invention, a test meter is provided which has a plurality of selectable test and/or report formats and comprises: selector means, operable responsive to a remote stimulus, for causing the meter to operate in a desired test and/or report format; means for contacting a test point and communicating a test signal to said meter, said signal being indicative of a value of a parameter at said test point; and means responsive to said signal for reporting said value. The remote stimulus can be provided by means of, for example, electromagnetic radiation, a sonic signal or an electrical contact or proximity switch.

Preferably, the means for contacting a test point comprises a contact probe configured for being held and positioned at a desired test point by hand and includes an electrical switch which is operable by hand while the probe is held in the locale of the test point. Most preferably, the probe will include two switch means operable by hand, one switch being coupled to said selector means to control test format and the other being coupled to said selector means to control report format. Desirably, the meter will include a visual display for reporting test results, and means for audible reporting test information comprising: means for storing a plurality of selectable report formats; a speech synthesizer; a microprocessor programmed to direct a selected report format to be utilized by the speech synthesizer; and an amplifier and speaker to report test information as speech in the selected report format.

According to another embodiment, the invention provides a test meter capable of reporting test results as speech in any one of a plurality of selectable report formats, which comprises means for receiving a test signal, and generating a meter output indicative of a measured value of a parameter, and directing said meter output to a microprocessor; means for storing a plurality of selectable report formats and directing a selected one to said microprocessor; selector means for causing a particular report format to be directed to said microprocessor; a speech synthesizer; and a microprocessor programmed to receive said meter output and cause the speech synthesizer to audible report test results in a selected format. As in the other embodiment, preferably the test meter will also include a visual display for reporting test results, and the selector means will be operable responsive to a remote stimulus. Preferably, the means for receiving test signals comprises a contact probe configured for being held and positioned by hand and includes an electrical switch which is operable by hand while said probe is held in contact with a desired test point. Most preferably, two switches will be located on the probe and operable by hand, one switch being dedicated to control test format and the other being dedicated to control report format.

According to one preferred embodiment of the invention, the two principal aspects are combined to provide a multimeter which provides even further improved efficiencies and use of operation due to the enhanced ability of the operator to interact with the meter with a minimum of required distractions. The multimeter according to this aspect of the invention comprises: selector means including a microprocessor, operably responsive to a remote stimulus as well as switching means on the meter, for causing the meter to operate in desired test and report formats; probe means for receiving a test signal; an autoranging multimeter circuit capable of generating a meter output responsive to said test signal and indicative of a measured value of a parameter, and directing said meter output to a microprocessor; means for storing a plurality of selectable report formats and directing a selected one to said microprocessor; selector means for causing a particular report format to be directed to said microprocessor; a speech synthesizer; and a microprocessor programmed to receive said meter output and cause the speech synthesizer to audible report test results in a selected format.

According to still another embodiment in accordance with the invention a speaking multimeter is provided in which a main microprocessor controls its operation including automatic ranging, responding to probe inputs and servicing a display. A replaceable speech module is employed having a speech chip and a second microprocessor connected between the main processor and the speech chip. The main processor delivers meter data to the second microprocessor. This responds by sending command signals to the speech chip to cause it to speak the displayed meter data according to language rules programmed in the second processor. In this manner, the meter design can remain the same no matter where in the world it may be used while the speech module is altered to speak the local language.

BRIEF DESCRIPTION OF DRAWINGS

The invention will be better understood and its advantages will be more apparent from the following detailed description of Best Modes Of The Invention, especially when read in light of accompanying drawings, wherein:

FIG. 4 is a perspective view of a preferred embodiment of the invention showing a speaker at the rear of a multimeter;

FIG. 5 shows, schematically and partially in section, a foreshortened view of a specialized contact probe of the invention.

FIG. 7 is a perspective view of another "speaking" test meter in accordance with the invention;

FIG. 8 is a rear end view of the meter of FIG. 7;

FIG. 11 is a block diagram view of the electrical circuitry used in the test meter of FIG. 7;

FIG. 12 is a flow chart of the operation of the main processor in the test meter of FIG. 7;

FIG. 13 is a general flow chart of the operation of one speech module used in a test meter of this invention;

FIG. 15 is a listing of all data transferred from a main processor to a speech module used in the test meter of this invention;

FIG. 16 is a listing of words stored in digital format within a speech chip used in the test meter of this invention;

FIGS. 18-21 are flow charts used to speak measurements using respectively different radix routines.

BEST MODE OF THE INVENTION

The improvements provided by the invention can be employed in meters for testing one or a plurality of physical parameters. The meters can employ one or a plurality of contact probes or other sensors. The practical significance of the advantages are, however, most easily appreciated in test meters having a plurality test or report formats which employ at least two contact probes. Accordingly, for ease in describing the invention, the various improvements will be explained in the context of an electronic multimeter capable of testing voltage, current and resistance. The meter shown in FIG. 1 is a held-held meter of this type, and additionally has the capability of measuring temperature.

Figure 1:
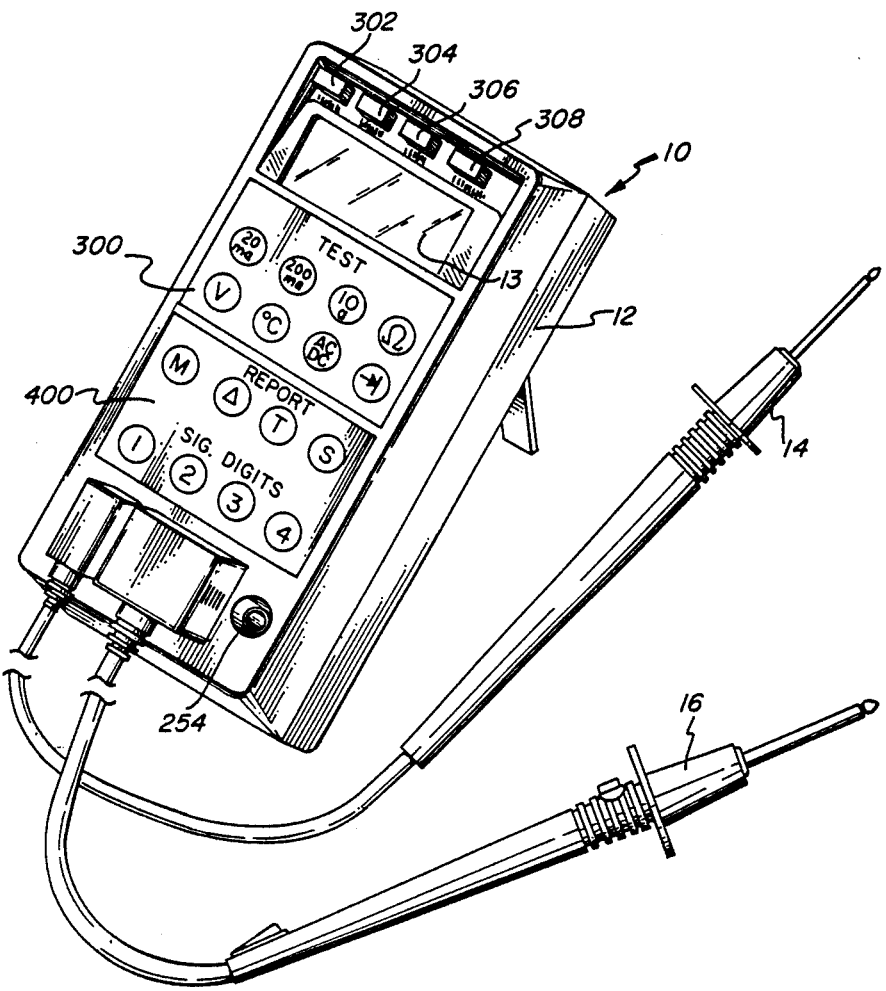
FIG. 1 is a perspective view showing the outward appearance of a multimeter according to the present invention.

The meter 10 shown in FIG. 1, includes a housing 12 and is operable with two hand-held contact probes 14 and 16. Contact probe 14 is desirably the "cold" probe and will be contacted with the negative or ground test point, while probe 16 is desirably the "hot" probe and will be contacted with the positive test point. The term "test point" is used simply to identify any point on a circuit or component it is desired to test.

Reference to FIG. 5 shows probe 16 foreshortened and partially cut away to reveal the detail of construction. Shaft 18 is constructed of a suitable plastic material and has a metallic contact 20 mounted at its front end. Contact 20 is adapted for electrical connection to the meter by means of conductor 22 and has a hollow interior which holds another sensor such as thermocouple 26, which can be of any suitable type and construction. Leads 28 and 30 extend from the thermocouple 26 for connection to the meter. The probe 16 is also shown to include two switches 32 and 40 at least one of which, preferably 32, is located so as to be operable by hand, while the contact probe 16 is held in the locale of a test point.

In the embodiment shown, these switches 32, 40 can provide a stimulus to selector means from a point remote from the meter itself to cause the meter to operate in a desired test and/or report format. The selector means, which preferably comprises a microprocessor programmed to direct meter operation in response to remote stimuli and switch means on the meter will be described in detail below.

While the device is shown as providing remote stimulus by means of electrical contact switches on the probe, other remote stimuli can be employed, including: proximity switches; electromagnetic stimuli such as radio waves, heat, light, (visible, ultraviolet, and infrared) can actuate switching devices responsive to them; sonic stimuli such as voice, clickers, whistles, or other stimuli (audible and inaudible) can actuate switching devices responsive thereto; and other sources of remote stimuli capable of transmitting a switching signal, e.g., remote telephones can provide stimuli and receive reports.

Switch 32 is shown here as a button-type, normally-open contact switch having contacts 34 and 36 electrically connected to leads 38 and 39 which enable connection to the meter. Switch 40 is shown also as a normally-open contact switch, including contacts electrically connected to leads 46 and 48 which enable connection to the meter. Preferably, of these switches, 32 is coupled to the selector means to control test format and the other, e.g. 40, is similarly coupled to control report format In the preferred embodiment, the switches will be operable without setting the probe down. For example, switch 32 can be located for ease of operation by the index finger and switch 40 for operation by the thumb.

Control of test and/or report format by the operator at the point of test, remote from the location of the meter, is extremely advantageous. The term "test format" is defined to mean a testing routine which requires a combination of variables including identification of the parameter to be tested, the scale to be used, and any other function defining a test procedure which is required by the meter circuitry to accurately measure and report test results. The term "report format" is defined as a routine for reporting a combination of variables including identification of the parameter being tested, the scale range, any warnings or special procedures to be followed, the frequency of reporting, the number of significant figures reported and the sequence of reporting these and other variables which are significant to yield a clear and concise report with sufficient detail under the circumstances.

As will be described later, means, typically ROM chips, are provided to store a plurality of different report formats which can be accessed by the selector means in response to remote stimulus or on-meter switching means. Upon command from the selector means, the desired test and/or report formats are directed to a microprocessor to cause the meter to function in the desired test and/or report format As will be described later, reporting can be by a visual display, or by an audible signal such as synthesized speech via speaker 15 shown in FIG. 4, or a combination of these. However, the visual display, such as LCD shown as 13 in FIG. 1, will most typically be controlled to operate in a standard format, which, for example, indicates the parameter being measured, the range scale, whether AC or DC current is involved, and the full complement of digits capable of display.

Figure 2:
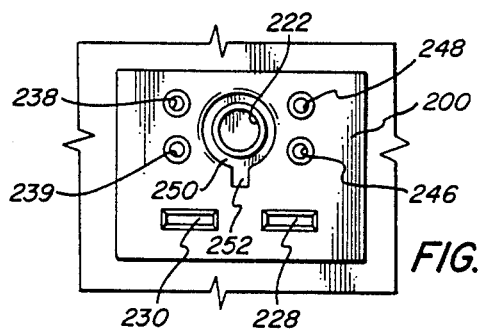
FIG. 2 shows the detail of a female connector on the front panel of the multimeter for a specialized contact probe of the present invention.
Figure 3:
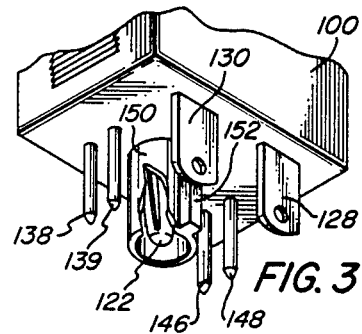
FIG. 3 shows, in perspective, the detail of a male connector for mating a specialized contact probe of the invention with a meter by means of a female connector as shown in FIG. 2.

Referring now to FIGS. 2 and 3, a preferred combination of female and male connectors for utilization with contact probe 16 shown in FIG. 5 is shown. Male connector 100 has male member 122 for electrically connecting the probe 20 to the meter via mating with the female connector 200 at plug receptacle 222. Male members 128 and 130 are preferably sized as conventional thermocouple male connectors and electrically connect the thermocouple 26 to slots 228 and 230 on female connector 200. Similarly, male members 238 and 239 electrically connect the test format selector switch to the meter. And, male members 146 and 148 mate with female members 246 and 248 to electrically connect the report format selector switch to the meter. Sleeve 150 has key 152 to assure proper alignment of the male plug 100 into female receptacle 200 by mating with hole 250 having keyway 252. Receptacle 254 can receive a standard male probe plug for high amperage tests.

It is an advantage of the particular female connector 200 shown that it can be employed with specialized male connector 100 or can receive a conventional thermocouple male connector if this is desired, say where a specialized thermocouple is required, and it can also receive a standard test probe male connector where this is desired.

By operating the remote test mode selector switch, the selector means is stepped through a predetermined sequence of test formats; for example, first AC or DC, then ohms, then amps, then voltage and then temperature. Where, as in the preferred embodiment of the invention, the meter is of the autoranging type, there will be no need to select range of scale manually. However, the microprocessor of the selector means can be programmed to step through various scale ranges by, say giving two switching pulses in rapid succession.

Manual on-meter electronic test format selector switches are also provided for any of the same test formats controlled by selector switch 32 as well as for different test formats, as is desired. The test format switch panel 300 on the meter in FIG. 1 is preferably a membrane panel enabling electronic switching without more complex and costly mechanical switches. Panel 300 shows eight test formats on switch pressure points. These enable testing for amperage on the 20 milliamp (20 ma), and 200 milliamp (200 ma) and 10 amp (10a) scales, ohms ($\Omega$), voltage (V), temperature in degrees Celsius ( C), either AC or DC (AC/DC), or for circuit continuity ( 10 10 ). it will be possible of course to program for selection of any other desired test formats. It is desirable to display the test format selected on the visual display 13, and also to supply this information for selection as required by various audible reports formats.

In addition to the panel 300, button-type switches 302, 304 306 and 308 are provided for various meter control functions Switch 302 can, for example, be a power switch; 304 can lock the visual display on any current display; 306 can lock the meter on a particular report format; and 308 can lock the meter on a particular report format; and 308 can lock the meter on a particular test format.

Panel 400 is similar in construction to panel 300 and is shown to provide eight selector switches for selecting the desired report format. As shown, there is a memory switch (M) which causes any sequence of test reports to be stored, to the capacity of the memory, on a first-in-first-out basis, for alter review and recording. The meter will, when in the delta format ($\Delta$), report any change in test format selected by the operator or directed by the autoranging meter. In the timed report format (T), a test reading can be repeated, say every five seconds, to test for drift or other change in magnitude; in the single report format (S), the meter will delay a fixed amount of time, say 1 or 2 seconds, for the test reading to stabilize and then give a single report, without repeating it. Alternatively, in the single report format, the test signal can be tested electronically to assure its stability prior to giving the single report. The remaining switches (1), (2), (3), and (4) on report format selection panel 400 enable selecting the number of significant digits for the report. Any of the formats can also provide caution and override messages to the operator where damage to the meter or circuit may be possible or where an incompatible series of instructions was given as to test format and the microprocessor has caused override of the instructions.

It is also desired to include a suitable interface such as a telephone jack and/or a RS 232 port for enabling receiving test and report format instructions and transmitting test results or warnings. For example, a telephone call can be initiated by the meter where an ongoing test with fixed probes senses a predetermined desired or undesired value or condition. The report can be made by speech with the remote operators having the ability to give further instructions. Also the test information can be continuously or periodically transmitted to a computer for storage and/or analysis.

Figure 6:
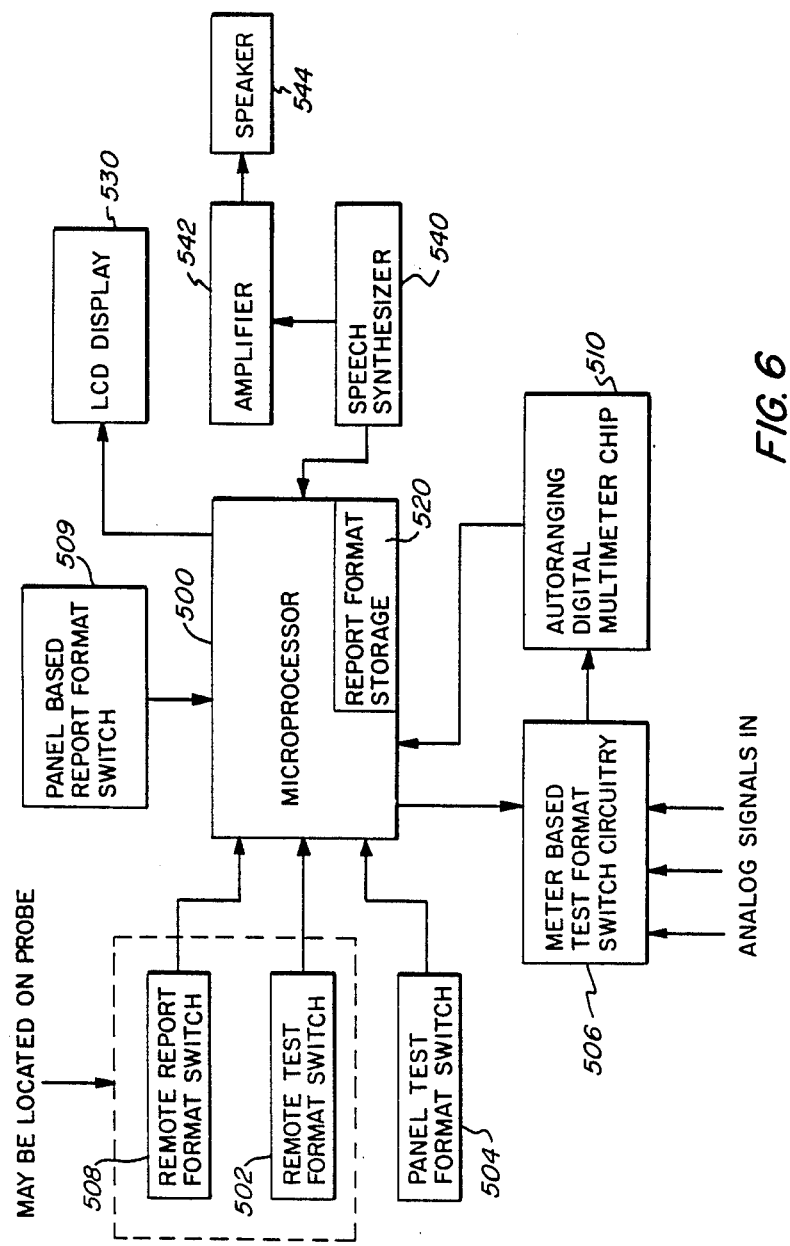
FIG. 6 is a block diagram showing the arrangement of circuit components for a preferred embodiment of the invention.
Figures 9, 10:
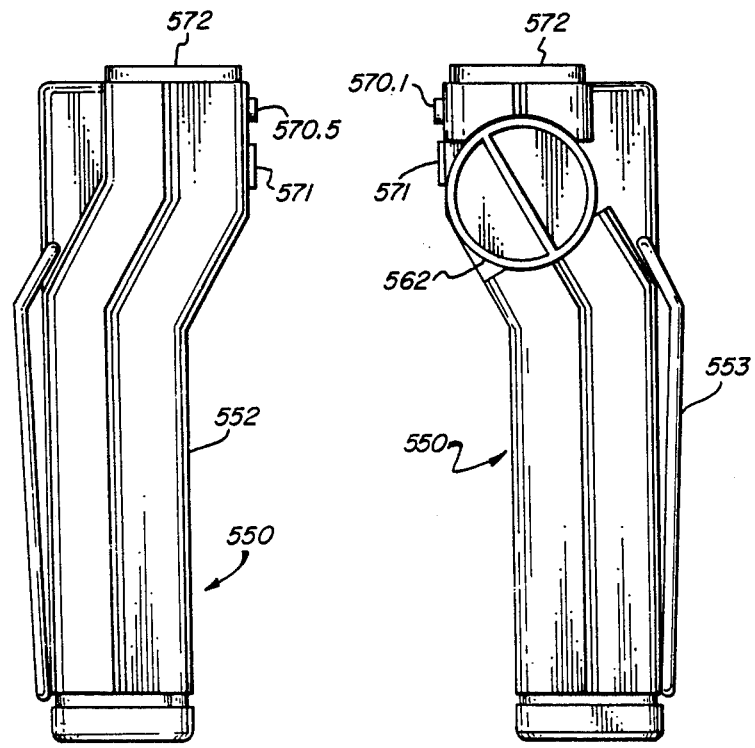
FIG. 9 is a right side view in elevation of the meter of FIG. 7.
FIG. 10 is a left side view in elevation of the meter of FIG. 7.

Reference is now made to FIG. 6 which shows a block diagram representing the interrelations of basic circuit components for a preferred form of the invention. Centrally located in FIG. 6 is a microprocessor 500 which is programmed preferably: to receive signals from test format switching means including remote 502 and local 504 (on the meter housing) switches generate a test format selection signal, and send the test format selection signal to a meter circuit 510 to cause the meter to operate in the selected format (the meter will preferably include internal test format switching circuitry 506 to select the appropriate analog input from test probes or other input device on instructions from the microprocessor); to receive a meter output signal indicative of a measured value of a parameter and generate a report signal according to a selected report format; to receive signals from report format switching means, both remote 508 and local 509, generate a report format selection signal, and send the format selection signal to means 520 which store a plurality of report formats to cause the selected report format to be directed to the microprocessor; to receive the selected report format and generate a report signal according to the selected report format; and to generate a signal indicative of the desired report and send that signal to a visual display 530 and/or a speech synthesizer 540 to audibly report the test results as synthesized speech in the selected report format A microprocessor, such as an NEC 7503 can be employed.

Suitable as the speech synthesizer is a 7759 available from NEC. Preferably, replaceable ROM chips, such as an NEC 23C100, will be employed to enable the speech synthesizer to operate in any of a number of desired languages. The speech synthesizer will receive a signal indicative of the desired report and transmit it to the speech synthesizer which in combination with an amplifier 542 and speaker 544 will audibly report test results and other desired test information in the selected report format and the desired language. The term "speaker" is meant in its generic sense and includes all electroacoustical transducers effective for reporting audible speech and includes such devices and earphones and the like. If desired, a simple on-off switch can be operated on the meter or remotely to turn the speaker on and off as desired.

The various report formats are burned into means 520 which can comprise ROM chips as above or those on board the processor as above.

FIGS. 7 through 10 show another form for a speaking test meter 550 in accordance with the invention. Meter 550 has a generally rectangular cross-section housing 552 formed with a first portion 554 containing a speaker 556 (see FIG. 11) behind a slotted segment 558. Another portion 560 includes controls provided in the form of a rotary function selector 562 connected to the pole of a multiple position switch inside housing 552. The function selector 562 enables the generation of unique function signals by which meter 550 can measure temperature, millivolts, volts, ohms, milliampers and amperes. For these functions, probes such as 14 and 16 of FIG. 1 are inserted into probe connectors 564.1–564.3. Temperature is measured with one or several thermocouple probes that are connected to temperature receptacles 566.1 and 566.2 at the rear of housing 552. A pivoting handle 553 is provided. Meter 550 has an auto-ranging capability.

In the various function settings of function selector 562 different operating modes are provided with mode selection switches 570.1 thorough 570.5 located above a digital, four decimal digit display 572. The mode switches 570 provide, by respective repeated actuations, an AC or DC mode with switch 570.1; a temperature selection with switch 570.4 using a single thermocouple T1 or T2, or the difference T1–T2 between them; a centigrade or Fahrenheit temperature scale selector with switch 570.5; a continual speech pattern, or one that operates on command only or one that operates at selected intervals by switch 570.3 and a display roundoff selector 570.2 with which one can limit the display to the right of the decimal or radix point. As explained below, the displayed digits are the ones that are spoken. Selection of anyone mode with any one switch can be done with repeated actuations that cycle through all the modes controlled by the switch. A speech request signal generating switch 571 is provided to stimulate a speaking of a value at the meter. A commonly available multimeter chip is employed such as the Max 133 made by the Maxim Corporation.

In the embodiment of FIGS. 7–10, the test meter's speaking capability is made particularly suitable for adaptation to different languages. This is done by incorporating, as shown in FIG. 11, in addition to a main microprocessor 590, a replaceable speech module 592. The speech module 592 includes a slave microprocessor 594 and a speech chip 596. The speech chip stores the digital samples of various words that need to be spoken in order to enunciate the meter functions, modes and parameter values through speaker 556. The speech chip is a standard device, such as the NEC 7554 and responds to the control signals from the slave microprocessor 594. The latter in turn operates to translate the meter data to be pronounced into signals that then can cause the speech chip to pronounce the meter data in the proper way.

Hence, processor 594, being a replaceable device with chip 596, can be programmed with the rules of the specific language to be spoken while the test meter with its main processor 590 can remain the same. This simplifies the test meter 550 while still accommodating the various language complexities that are encountered.

Communication between the main processor. 590 and the speech module 592 is obtained along a serial port 598 with the aid of control lines and a busy or ready control line 600. Data is transferred from the main processor 590 in a fixed serial train of bit pulses whenever the meter 550 requires a spoken format.

The operation of main processor 590 is generally set forth in the steps illustrated in FIG. 12. Various automatic operations are performed, some of which are well-known. Thus, at 602 various flags, registers and memory locations are reset or set to initial values. At 604 various selected meter functions and modes are stored and the occurrence of a new selection by the operator is noted by setting an appropriate flag. The display settings are identified at 606 along with a suitable round-off number that corresponds to how many digits are to be displayed.

Ordinarily, test meter 550 can display parameter values in four digits. For example, in a lower scale, one digit can be on the left of the decimal point and three on the right. In measuring and speaking of a parameter, however, the operator may only be interested in two of the digits, namely, the one to the left and the one to the right of the decimal point and hearing the meter speak all four digits can be both bothersome and unnecessary.

In the meter of this invention, therefore, the operator can select a display of desired digits by producing a round-off signal with mode switch 170.2. Actuation of this switch successively, cycles the display through a showing of one, two, or three digits to the right of the decimal point, depending upon the scale. The main microprocessor 590 identifies this round-off number at step 606.

At 608 the parameter of interest is measured and its value stored and displayed. A test is then made at 610 whether a spoken format of the parameter measurement is required only upon command as selected with mode switch 570.3, such command is generated when the probe switch 32 or switch 571 is actuated, see FIGS. 5 and 11. If so, the presence for such command is tested for at 612. In the absence of a command, a return is made to step 604.

If a command is present or if a speech request arises because the regular interval between such requests, as selected by mode switch 570.3, was terminated as tested at 614, then a speech routine is entered at 616. Meter data is transferred at 618 to the speech module 592 and a return is made to step 604.

The slave microprocessor 594 of FIG. 11 is programmed with a read only memory to respond when requests are made for a speech command. The processor 594 operates as illustrated in FIG. 13, starting at step 620 with various program start up routines including resets, flag setting, etc. At 622 a test is made whether a request for speaking has been received from the main processor 590. If not, the slave processor continues in this waiting mode If so, however, data from the main processor 590 including the most recent measurements are transferred at 624 into slave processor memory 626. The data transferred consists of the information as set forth at 630 in FIG. 15 and is transferred in serial format into memory 626 in FIG. 11. In response the slave microprocessor 594 sends a busy signal on line 600 (see FIG. 11) and commences at 640 in FIG. 13 with a resetting and initializing of the speech chip 596.

At 642 the new function flag received from processor 596 is checked for whether the operator had selected a new function or a new mode. If so, the current function is identified at 646 and the speech chip instructed to audibly speak the function at 648. At 650, the current mode is identified and its spoken format occurs at 652. A return is then made at 654 to await the next speech request at 622.

In this manner, an operator can cause a change in function or mode without also causing a probably meaningless speaking of a measurement since the probes probably have not yet been applied to appropriate test points.

In the event no new function or mode was selected as determined at 642, the processor 594 proceeds to instruct the speech chip 596 to speak the current mode at 660 and at 662 the value of the measurement in accordance with the round-off in effect for the display is identified and this value is spoken at 664. A return is then made to await a speak request at 622.

The speech chip 596 is provided with digital words representative of digitized samples of analog speech of the words needed to compose all of the test meters functions, modes and measurements. The speech produced by the chip then includes combinations of the words in the sequence as called out by processor 594. The words are recomposed into an analog form by a d/a converter whose output is applied to an amplifier 670 (see FIG. 11) coupled to drive speaker 556.

FIG. 16 shows at 672 the words stored in speech chip 596. These include the whole integers from zero through twenty, the decades through ninety, and those others as shown. The rules of speech then cause these words to be combined to say for example "two hundred fifty six point three ohms" for a measurement of 256.3 ohms.

Figure 14:
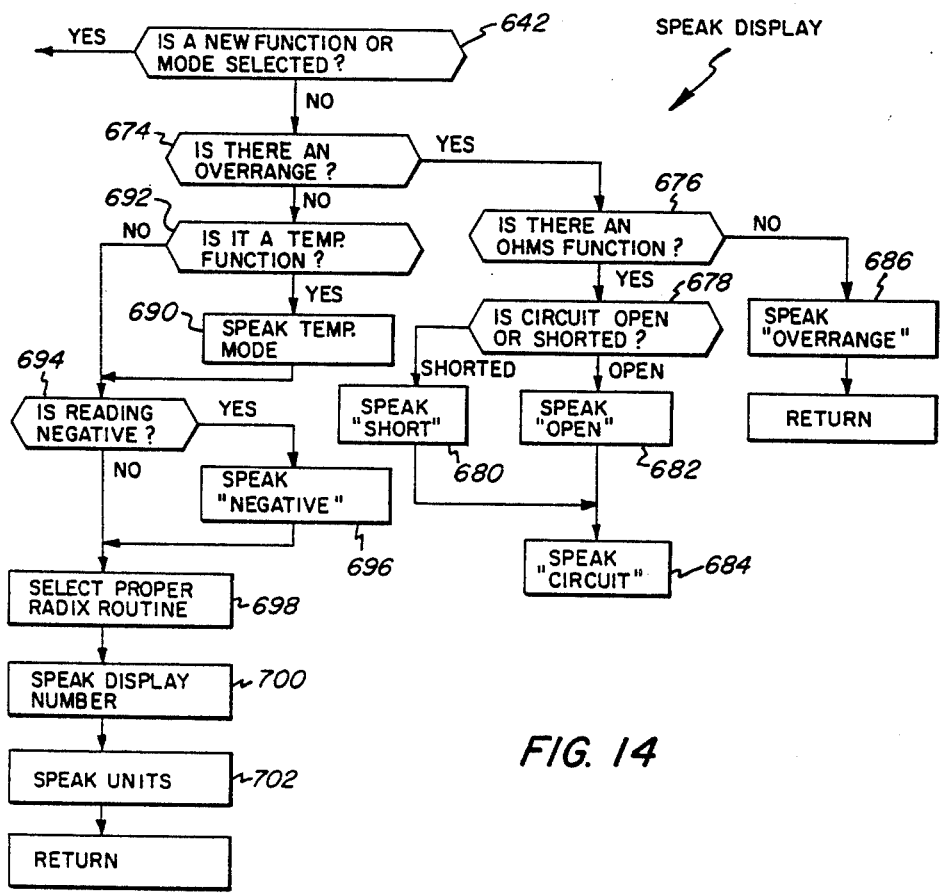
FIG. 14 is a more detailed view for a flow chart for the speech module used in a test meter of this invention.

FIG. 14 illustrates slave processor 594 steps with greater detail. After test 642 determines that for an existing function and mode, a new measurement is to be spoken, a test is made at 674 whether an overrange condition occurred This test involves examining the overrange flag shown in FIG. 15 and corresponds to either an excessively high or low measurement by the main processor 590. If so, the next test at 676 is whether resistance is being measured so that a subsequent test at 678 can determine whether this is a short circuit or open circuit condition. The corresponding words are spoken at 680 or 682, and 684 before a return is made to step 622 in FIG. 13.

If no resistance is being measured "overrange" is spoken at 686 and a return is made to 622 in FIG. 13.

If no overrange condition exists then, after speaking the temperature mode at 690 after test 692, a test is made at 694 for negative measurements by checking the sign flag in FIG. 15. If negative, that word is spoken at 696.

At 698, the proper radix. routine is selected so that at 700 the number actually shown in the display can be spoken. The units represented by the number are then spoken at 702 and a return is made to step 622 in FIG. 13.

Figure 17:
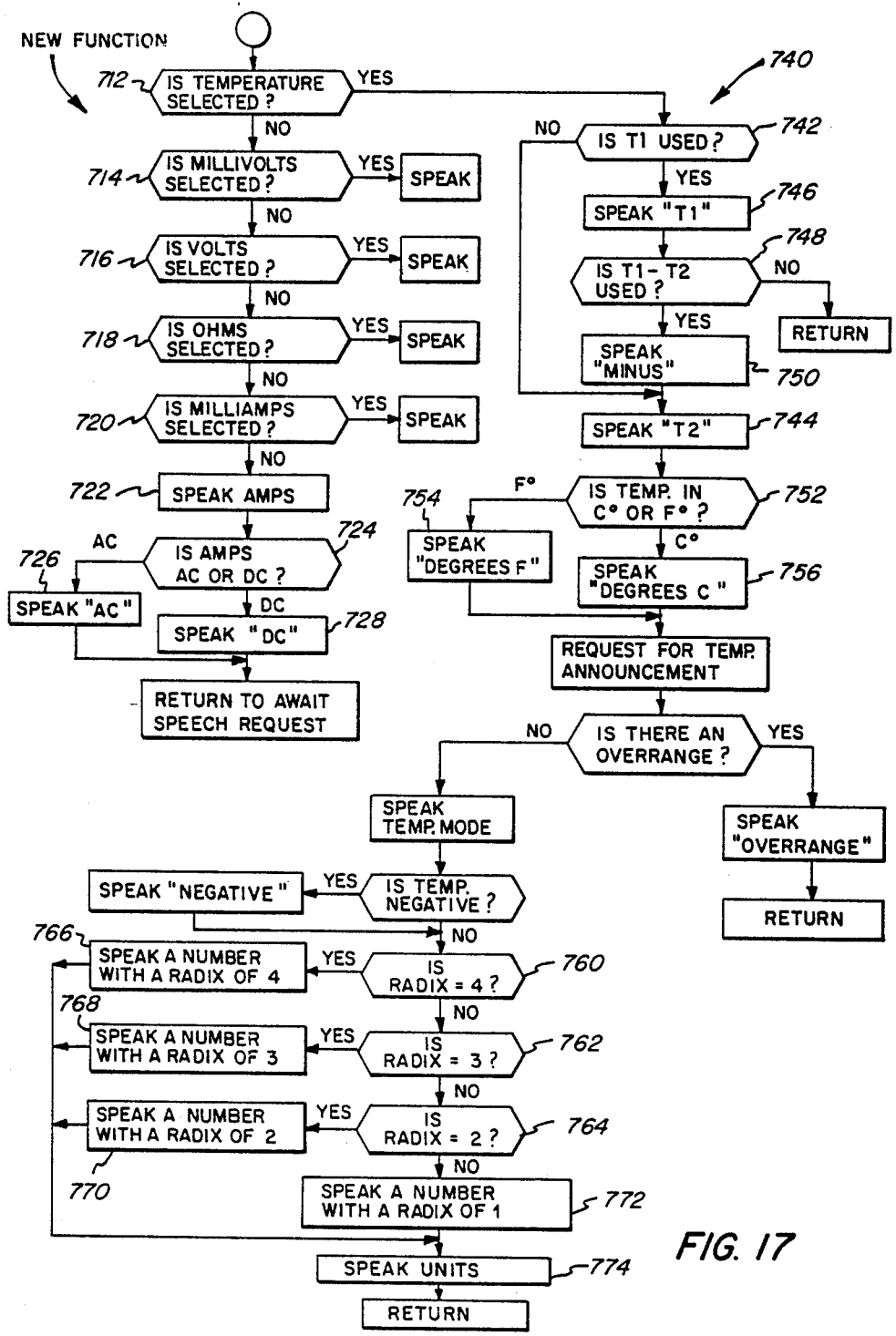
FIG. 17 is a more detailed flow chart of steps used in operating a speech module used in a test meter of the invention.

FIG. 17 illustrates the portion of FIG. 13 in greater detail for the case where a new function is selected. Detailed illustrative steps are shown for the case where temperature is the new function, followed by another speaking request to illustrate the speaking routine for a particular temperature measurement.

At 712 a test made whether the new function, as identified by the new function flag, is temperature. If not, a test is made at 714 whether the new function is millivolts. This continues at tests 716, 718 and 720 for the functions as noted, until by process of elimination the new function must be amperes. This is spoken at 722 and after DC or AC modes are identified at 724 the modes are spoken at 726 or 728. Note that the other functions are handled in a similar manner.

When temperature is the new function or new mode, a routine at 740 is entered to first speak the temperature mode. Thus at 742 a test is made whether a thermocouple at the T1 port is used. If not, then the "T2" mode is spoken at 744. However, if this thermocouple is used, then after T1 is spoken at 746 and a test at 748 confirms that the difference mode T1-T2 is used, the word "minus" is spoken at 750 followed by "T2" at 744.

At 752 a test is made whether temperature is being measured in centigrade or Fahrenheit and the appropriate mode is pronounced at 754 or 756.

If after a new temperature function or mode has resulted in an announcement, then following the steps as shown, tests are made at 760, 762 and 764 to determine the radix being employed in the display. In each case where that display radix is identified, an appropriate number is spoken according to the routines 766, 768, 770 and 772, followed by the speaking of the units for that measurement at 774, in this case °C. or °F.

FIGS. 18 through 21 illustrate the number speaking routines employed with different radices. In case of a radix of four (see FIG. 18) a number in the thousand can be spoken at 780, unless it is zero. Then the hundreds digit is spoken at 782 unless it is zero, and a tens digit at 784 if that is not zero until at 786, a ones digit is spoken. Note the exception for a teens number which is spoken at 788 if needed while subsequently skipping the tens and ones digits.

The number speaking routine thus follows the rules that are peculiarly applicable to the English language. If another language is used, a different number speaking routine probably would be needed.

In the FIGS. 19-21 a test is also made whether numbers occur after the radix decimal point since the meter does provide four digit measurements. Thus at 794 a test is made whether there are digits after the radix point as shown in the main processor data in FIG. 15. If there is such digit, the decimal "point" is spoken at 796 followed at 798 by the first digit after the decimal point.

In FIG. 20 for a radix of two there can be two digits after the decimal point, but the second digit is not spoken if it is zero as determined at 800. In FIG. 21 all digits present in the display to the right of the decimal point are spoken at 802

The above description is for the purpose of teaching the person or ordinary skill in the art how to practice the present invention, and it is not intended to detail all those obvious modifications and variations of it which will become apparent to the skilled worker upon reading the description. It is intended, however, that all such obvious modifications and variations be included within the scope of the present invention which is defined by the following claims.

We claim:

1. A test meter capable of testing and displaying a plurality of parameters and of reporting the results in a plurality of formats, comprising:

first selector switch means responsive to an electrical signal on an electrical conductor, for changing the report format of the test meter through a plurality of report formats in a predetermined sequence;

second selector switch means responsive to an electrical signal on an electrical conductor for changing the test parameter formats of the test meter through a plurality of parameter formats in a predetermined sequence;

an independently locatable and movable probe having an extended multi-conductor lead detachably connected to the test meter;

one of the conductors in the multi-conductor lead being coupled to said first selector switch means and another one of the conductors in said multi-conductor lead being coupled to the second selector switch means;

said probe having a first control switch coupled to send an electrical signal on said one conductor in said lead so as to operate said first selector switch means to change to the report format of said test meter;

and, said probe having a second control switch coupled to send an electrical signal on said other conductor in said lead so as to operate said second selector switch means to change the test parameter format of said test meter.

2. A test meter according to claim 1, wherein said probe further includes a thermocouple for sensing temperature, the thermocouple leads being coupled to the test meter through additional conductors in said multi-conductor lead.

3. A test meter in accordance with claim 1 capable of reporting test results as speech in any one of a plurality of selectable report formats, further comprising:

microprocessor means for controlling the reporting of test results as speech;

means for receiving a test signal, generating a meter output indicative of a measured value of a parameter, and directing said meter output to said microprocessor means;

means for storing a plurality of selectable report formats and directing a selected one to said microprocessor means; and a speech synthesizer; wherein said first selector means selectively causes a particular report format to be directed to said microprocessor; and said microprocessor means is programmed to receive said meter output and cause the speech synthesizer to audibly report test results in a selected format.

4. A test meter according to claim 3 wherein the detachable connection of said probe to said test meter includes connection to said means for receiving test signals and said probe is configured for being held and positioned by hand and said first and second control switches are operable by hand while said probe is held in contact with a desired test point.

5. A test meter according to claim 4 wherein said probe further includes a means for sensing temperature coupled through said multiconductor lead to one half of a separable connector in common with conductors for other components of the probe, and said meter includes on a housing a mating half of a separable connector which is configured to receive said one half of said connector thereby detachably coupling said multi-conductor lead to said meter.

6. A test meter according to claim 1 which further includes means for audibly reporting test information.

7. A test meter according to claim 6 wherein said first selector means enables control of said means for audibly reporting.

8. A test meter according to claim 6 wherein said means for audibly reporting test information comprises: speech synthesizer means, microprocessor means programmed to function with the speech synthesizer means, and an amplifier and speaker to report test information as speech.

9. A test meter according to claim 8 wherein said means for audibly reporting test information further comprises electronic means for storing a plurality of selectable report formats.

10. An electronic multimeter having a plurality of selectable test and report formats comprising: selector means including first microprocessor means, operably responsive to a remote electronic stimulus as well as switching means on the meter, for causing the meter to operate in any one of a plurality of sequentially selectable desired test parameter formats and in any one of a plurality of separately sequentially selectable report formats;

an independently locatable and moveable probe means for receiving a test signal, said probe means being detachably coupled to said test meter by an extended multi-conductor lead for transmitting a test signal to said test meter through at least one of said conductors;

said probe further having control switch means thereon for sending an electronic stimulus over a predetermined conductor of said multi-conductor lead to operate said selector means;

an autoranging multimeter circuit capable of generating a meter output responsive to said test signal and indicative of a measured value of a parameter, and directing said meter output to a second microprocessor means;

third microprocessor means for storing a plurality of selectable report formats and directing a selected one to a second microprocessor under direction of said selector means;

a speech synthesizer means; and a second microprocessor means programmed to receive said meter output and a selected report format to cause the speech synthesizer means to audibly report test results in a selected format.

11. A multimeter according to claim 10 wherein said probe comprises a contact probe configured for being held and positioned in the locale of a desired test point by hand and said control switch means is operable by hand while said probe is held in contact with a desired test point.

12. A multimeter according to claim 11 wherein said control switch means located on said probe and operable by hand, includes two independently operable switches, one switch being coupled to said selector means to control test format and the other being coupled to said selector means to control report format.

13. A test meter according to claim 12 wherein electronic means are further provided for storing a plurality of test format messages and for directing a selected of said messages to said second microprocessor; and said second microprocessor is programmed to cause the speech synthesizer to audibly report a test format message in response to selection of a given test format.

14. A test meter for measuring and displaying a selected one of a plurality of different parameters and having speech generating means to produce audible speech of the selected parameter, comprising:

first microprocessor means for generating a plurality of meter data signals related to the current operation of the meter and the measured value of the selected parameter;

second microprocessor means operatively connected to the first microprocessor means, for storing words to be audibly reproduced in a desired language and representative of various measurements, functions and modes related to parameters that can be measured and displayed by the meter; and third microprocessor means effectively coupled between the first microprocessor means and the second microprocessor means for delivering, as determined by said plurality of meter data signals from the first microprocessor means, a plurality of command signals to the second means to cause the latter to generate audible reproductions of selected ones of said plurality of signals in conformance with rules applicable to the desired language.

15. A test meter according to claim 14 wherein the second and third microprocessors together define a speech module which is detachable and replaceable independently of said first microprocessor means.

16. A test meter according to claim 14 and further including:

means for generating a first temperature signal representative of a measurement with a first temperature probe;

means for generating a second temperature signal representative of a measurement with a second temperature probe; and means for generating a signal representative of the difference between the first and second temperature signals.

17. A test meter according to claim 14 wherein said first, second and third microprocessor means together form an integral microprocessor unit.

18. A test meter according to claim 14 wherein said first microprocessor means is further capable of generating speech request signals on demand; and said third microprocessor means includes:

means responsive to a speech request signal from the first microprocessor for initiating the delivery of said plurality of command signals to the second microprocessor means.

19. A test meter according to claim 18 and further including:

directing means in said first microprocessor means for delivering, effectively in response to a speech request signal, said plurality of meter data signals to the third microprocessor means.

20. A meter according to claim 19 and further including:

means in said third microprocessor means for storing speech rule signals for determining a sequence of command signals needed to produce said audible reproductions compatible with the desired language.

21. A test meter according to claim 20 and further including:

an independently locatable and moveable contact probe coupled to said test meter by an extending multiconductor lead configured for being held and positioned at a desired test point by hand, and switch means on said probe for sending a signal through a conductor of said lead to initiate said speech request signal from said first microprocessor means.

22. A test meter according to claim 19 and further including:

electronic means for selecting a desired display resolution of parameter measurement and producing a round-off signal indicative thereof; and electronic means responsive to the round-off signal for controlling the selection of the command signals to establish an audible pronunciation of the displayed parameter measurement.

23. A test meter according to claim 22 and further including:

means for rounding-off displayed parameter measurements to a desired place on the right side of the decimal point and generating said round-off signal indicative thereof.

24. A test meter according to claim 23 wherein said plurality of meter data signals that are delivered to the third microprocessor includes said round-off signal.

* * * * *